United States Patent
Ozdemir et al.

(10) Patent No.: US 9,405,681 B2
(45) Date of Patent: Aug. 2, 2016

(54) WORKLOAD ADAPTIVE ADDRESS MAPPING

(75) Inventors: Serkan Ozdemir, Barcelona (ES); Qiong Cai, Barcelona (ES); Ayose J. Falcon, L'Hospitalet de Llobregat (ES); Nevin Hyuseinova, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 13/995,469

(22) PCT Filed: Dec. 28, 2011

(86) PCT No.: PCT/US2011/067611
§ 371 (c)(1),
(2), (4) Date: Jun. 18, 2013

(87) PCT Pub. No.: WO2013/100975
PCT Pub. Date: Jul. 4, 2013

(65) Prior Publication Data
US 2014/0032873 A1 Jan. 30, 2014

(51) Int. Cl.
*G06F 12/02* (2006.01)
*G06F 13/00* (2006.01)
*G06F 12/06* (2006.01)
(Continued)

(52) U.S. Cl.
CPC .......... *G06F 12/06* (2013.01); *G06F 12/0646* (2013.01); *G06F 13/16* (2013.01); *G06F 12/0292* (2013.01); *G06F 2212/502* (2013.01); *G11C 13/0004* (2013.01)

(58) Field of Classification Search
CPC . G06F 12/0292; G06F 12/10; G06F 12/0646; G06F 2212/502; G11C 13/0004
See application file for complete search history.

(56) References Cited

U.S. PATENT DOCUMENTS

| 4,918,600 | A | 4/1990 | Harper, III et al. |
| 6,912,616 | B2 | 6/2005 | Heap |
| 8,108,596 | B2 | 1/2012 | Aldworth et al. |

(Continued)

FOREIGN PATENT DOCUMENTS

TW 201339837 10/2013

OTHER PUBLICATIONS

PCT International Search Report for PCT Counterpart Application No. PCT/US2011/067611, 3 pgs., (Jul. 31, 2012).

(Continued)

*Primary Examiner* — Kevin Verbrugge
*Assistant Examiner* — Rocio Del Mar Perez-Velez
(74) *Attorney, Agent, or Firm* — Nicholson De Vos Webster & Elliott LLP

(57) ABSTRACT

Embodiments of the invention describe an apparatus, system and method for workload adaptive address mapping. Embodiments of the invention may receive a request to initialize a system memory including a plurality of memory banks. Using a plurality of memory address mapping schemes for memory settings for the system memory, a system characterization workload is executed during the initialization of the system memory, the system characterization workload including a plurality of transactions directed towards the system memory. Embodiments of the invention may monitor target addresses of the plurality of transactions directed towards the system memory. One of the plurality of memory address mapping schemes is selected based, at least in part, on the target addresses of the plurality of transactions.

12 Claims, 13 Drawing Sheets

(51) Int. Cl.
  *G06F 13/16* (2006.01)
  *G11C 13/00* (2006.01)

(56) References Cited

U.S. PATENT DOCUMENTS

2009/0138654 A1* 5/2009 Sutardja .................... 711/103
2011/0153908 A1* 6/2011 Schaefer et al. ............ 711/5
2013/0132704 A1* 5/2013 Ware ......................... 711/206

OTHER PUBLICATIONS

PCT Written Opinion of the International Searching Authority for PCT Counterpart Application No. PCT/US2011/067611, 3 pgs., (Jul. 31, 2012).

PCT Notification concerning Transmittal of International Preliminary Report on Patentability (Chapter I of the Patent Cooperation Treaty) for PCT Counterpart Application No. PCT/US2011/067611, 5 pgs., (Jul. 10, 2014).

* cited by examiner

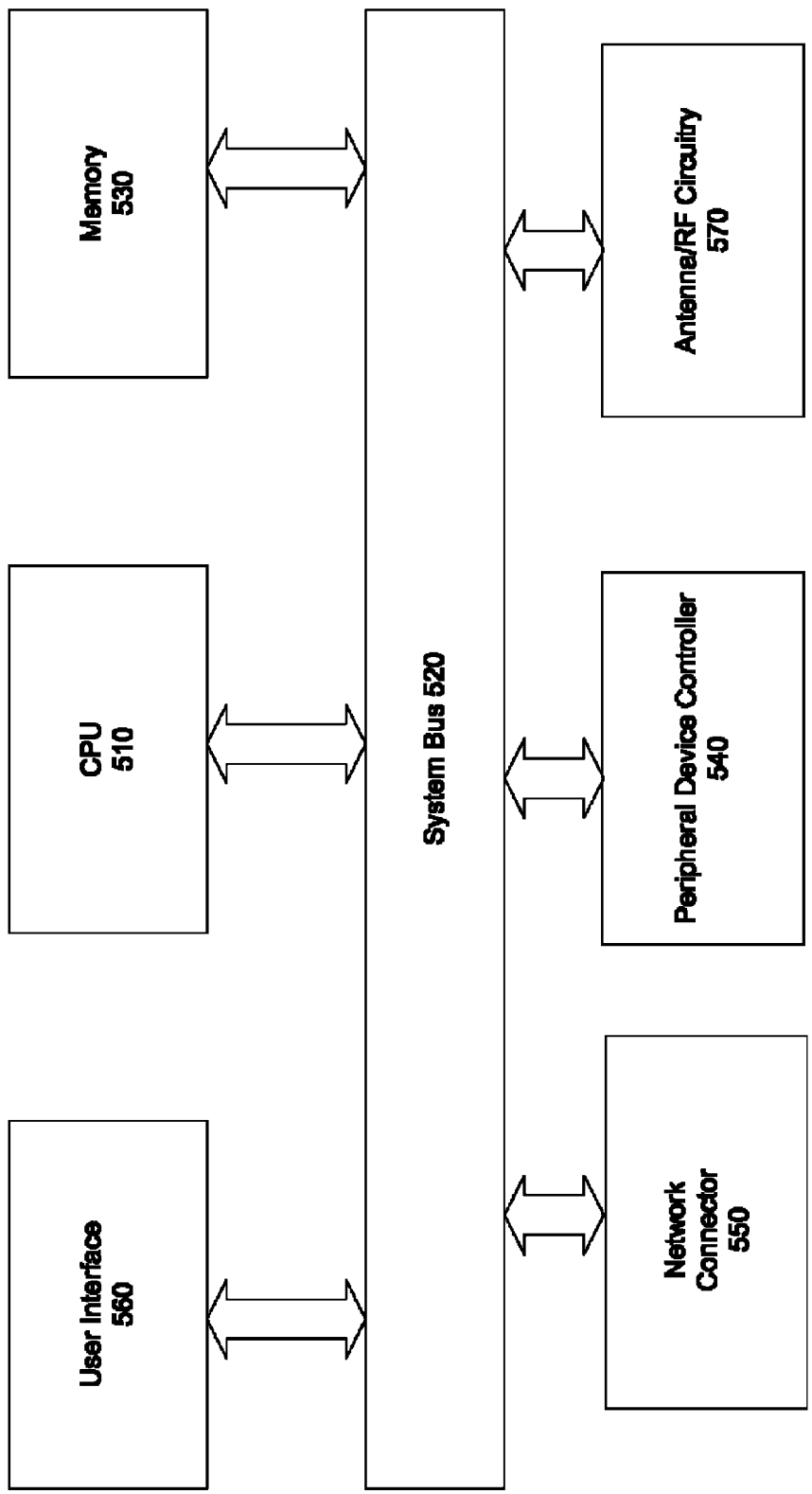

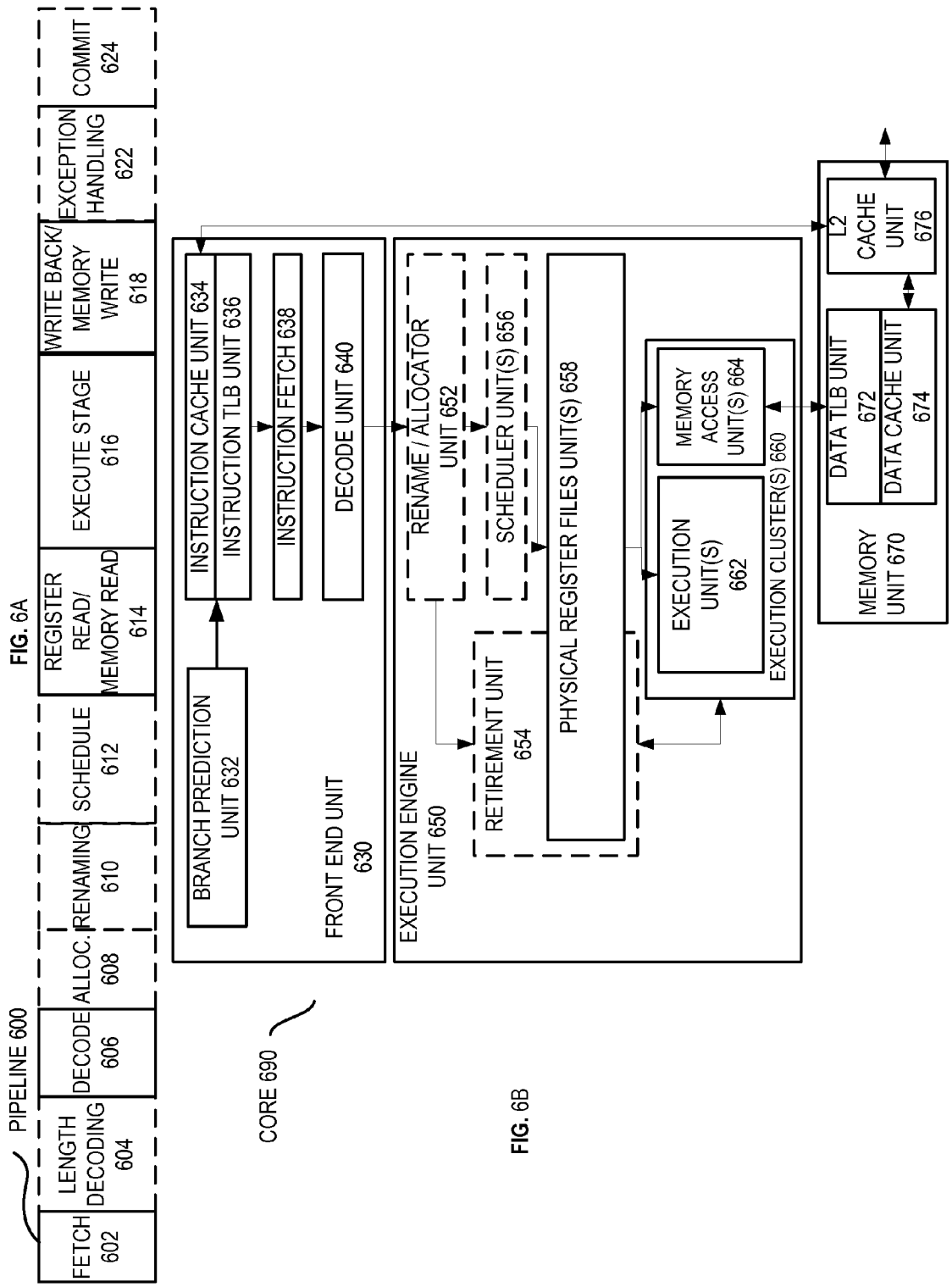

WORKLOAD ADAPTIVE ADDRESS MAPPING

CROSS-REFERENCE TO RELATED APPLICATION

This patent application is a U.S. National Phase Application under 35 U.S.C. §371 of International Application No. PCT/US2011/067611, filed Dec. 28, 2011, entitled WORKLOAD ADAPTIVE ADDRESS MAPPING.

FIELD

Embodiments of the invention generally pertain to computing devices and more particularly to workload adaptive address mapping.

BACKGROUND

System memory is typically arranged in the form of multiple memory banks. Consecutive read or write accesses to an address or addresses of one of the banks (i.e., consecutive memory accesses to the system memory directed to the same rank, same bank, but different pages) is referred to as a "memory bank conflict." Memory bank conflicts result in performance penalties due to latency, pre-access processes (e.g., pre-access charge processes), and the inability for parallel memory access and address decoding processes. This is especially true for Phase Change Memory devices, which have (relatively) long access times and thus suffer a greater performance penalty than other memory devices.

Current solutions for reducing the effects of bank conflicts are based on rearranging memory accesses in the event of a bank conflict—e.g., deferring the lowest priority memory access in the event of a bank conflict. These solutions are slow and require logic or modules to re-arrange memory access transactions on the fly. What is needed is a solution to reduce the likelihood of memory bank conflicts, and thus eliminate the need to defer or re-arrange memory access transactions.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 5 is block diagram of a system to utilize an embodiment of the invention.

FIG. 6A is a block diagram illustrating both an exemplary in-order pipeline and an exemplary register renaming, out-of-order issue/execution pipeline according to embodiments of the invention.

FIG. 6B is a block diagram illustrating both an exemplary embodiment of an in-order architecture core and an exemplary register renaming, out-of-order issue/execution architecture core to be included in a processor according to embodiments of the invention.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of an apparatus, system and method for workload adaptive address mapping are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Embodiments of the invention describe an apparatus, system and method for workload adaptive address mapping. Embodiments of the invention may receive a request to initialize a system memory including a plurality of memory banks. Using a plurality of memory address mapping schemes for memory settings for the system memory, a system characterization workload is executed during the initialization of the system memory, the system characterization workload including a plurality of transactions directed towards the system memory. Embodiments of the invention may monitor target addresses of the plurality of transactions directed towards the system memory. One of the plurality of memory address mapping schemes is selected based, at least in part, on the target addresses of the plurality of transactions.

Figure 1:
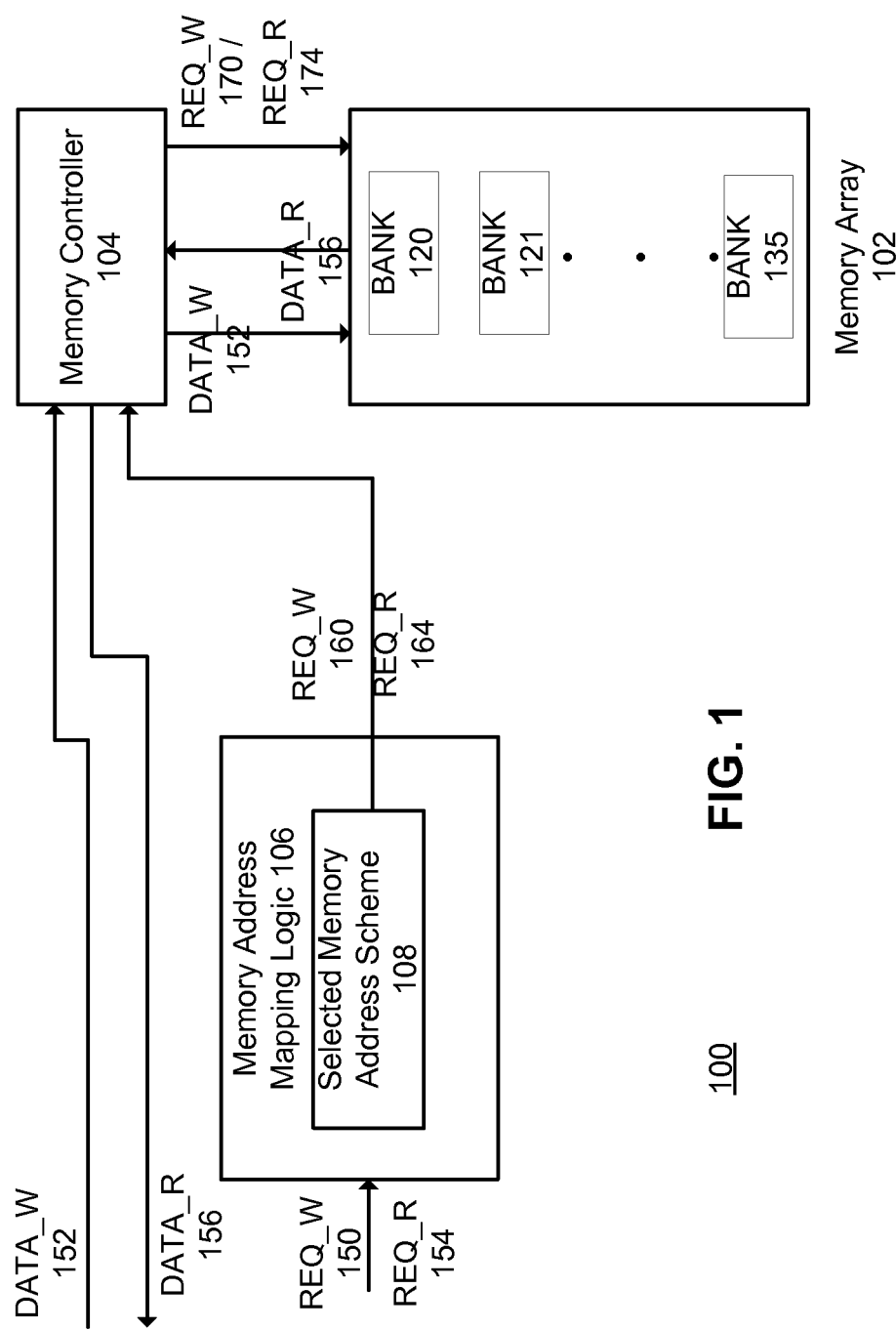
FIG. 1 is a block diagram of system memory implementing an embodiment of the invention.

FIG. 1 is a block diagram of system memory implementing an embodiment of the invention. System memory 100 includes memory array 102 having 16 memory banks (shown as memory bank 120, 121 . . . 135), memory controller 104 to control access to the memory array, and memory address mapping logic 106 to set memory address settings for read and write transactions. As described in further detail below, memory address mapping logic 106 implements one of a plurality of memory address mapping schemes.

In this embodiment, when receiving write request (REQ_W) 150, address mapping logic 106 generates transaction write request transaction 160 based on selected memory address scheme 108 and issues the transaction to memory controller 104. The memory controller forwards the write request (shown as reference element 170) and stores write data 152 to memory array 102 based on the memory address included in write request transaction 160 (i.e., the address in said write request transaction determines which memory bank and page write data 152 is read from).

When receiving read request (REQ_R) 154, address mapping logic 106 generates read request transaction 164 based on selected memory address scheme 108 and issues the transaction to memory controller 104. The memory controller forwards the read request (shown as reference element 174) and retrieves read data 156 based on the address included in read request 164 (i.e., the address in said read request transaction determines which memory bank and page read data 156 is written to).

Assuming both write request 160 and read request 164 are directed to different memory addresses, if said requests are directed towards different memory banks of memory array 102, then both request may be processed in parallel. However, if write request 160 and read request 164 are directed towards the same memory bank (e.g., selected memory address scheme 108 causes both transactions to be directed to different pages of memory bank 120), then a bank conflict occurs and said transactions cannot be processed in parallel. Embodiments of the invention select one of a plurality of memory address mapping schemes to eliminate or significantly reduce the likelihood of bank conflicts.

Figure 2:
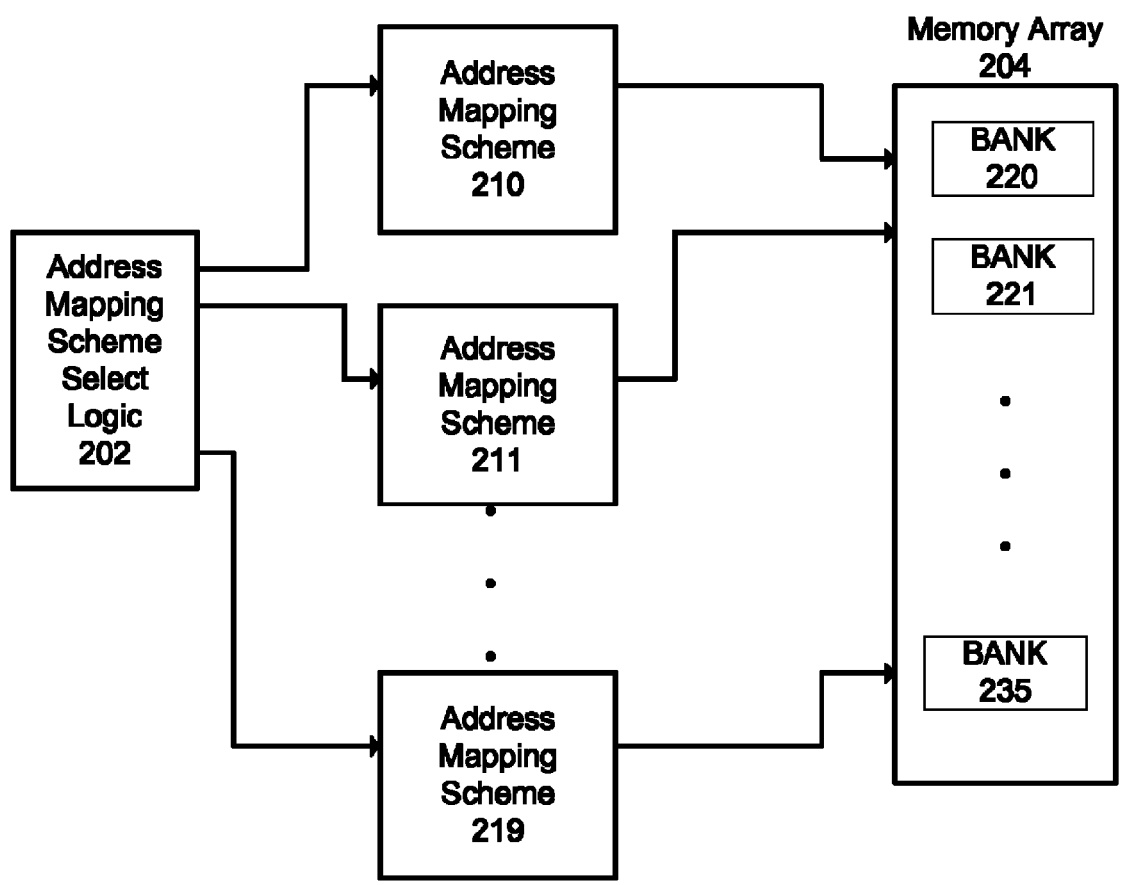
FIG. 2 is a block diagram of memory address mapping logic according to an embodiment of the invention.

FIG. 2 is a block diagram of memory address mapping logic according to an embodiment of the invention. In this embodiment, memory address mapping scheme select logic 202 is shown to select one of address mapping schemes 210, 211 . . . 219 for mapping read and write transactions to memory array 204. It is to be understood that FIG. 2 illustrates a logical connective flow of the above described elements according to an embodiment of the invention, and is not shown to illustrate physical logical connective limitations between said components. For example, address mapping schemes 210-210 may be input to memory address mapping scheme select logic 202, or may be retrieved individually by mapping scheme select logic 202, or any other equivalent means.

In prior art solutions, the memory controllers are designed for a single address mapping scheme regardless of the final product they are used in. The single address mapping scheme that is implemented is typically either oblivious to bank conflicts or they only try to minimize conflicts for certain types of address patterns (e.g., pre-determined stride memory access patterns). Other prior art solutions for reducing bank conflicts utilize larger or deeper buffers for memory access requests, which increases device size and complexity.

In this embodiment, the system memory controller has multiple address decoding circuitries (i.e., address mapping schemes 210, 211 . . . 219) that are pre-programmed to different address mapping schemes. Embodiments of the invention may include any number of different address mapping schemes. In some embodiments, the system memory controller is capable of keeping track of accesses to the memory during an initial training or calibration period, determining which one of the address mapping schemes would yield the best distribution across banks in memory array 204, and adapting to this particular address mapping scheme during the booting of the system. Said training or calibration period may be initiated by a system reset, a system memory configuration update, a system run-time request (which would further trigger the flushing of contents of memory array 204), etc.

The address mapping scheme selected by the system memory controller is to yield a reduced amount of potential bank conflicts during system operation. Thus, in some embodiments a characterization workload representative of runtime memory accesses is executed during the initialization or training period. Said characterization workload is executed using each of address mapping schemes 210, 211 . . . 219, and memory accesses are tracked to determine which mapping scheme provides the most optimal performance for the characterization workload. The selected mapping scheme may provide a relatively even amount of accesses for memory bank of memory array 204 (i.e., memory banks 220, 221 . . . 235), the least amount of consecutive accesses to a single memory bank, etc.

Figure 3:
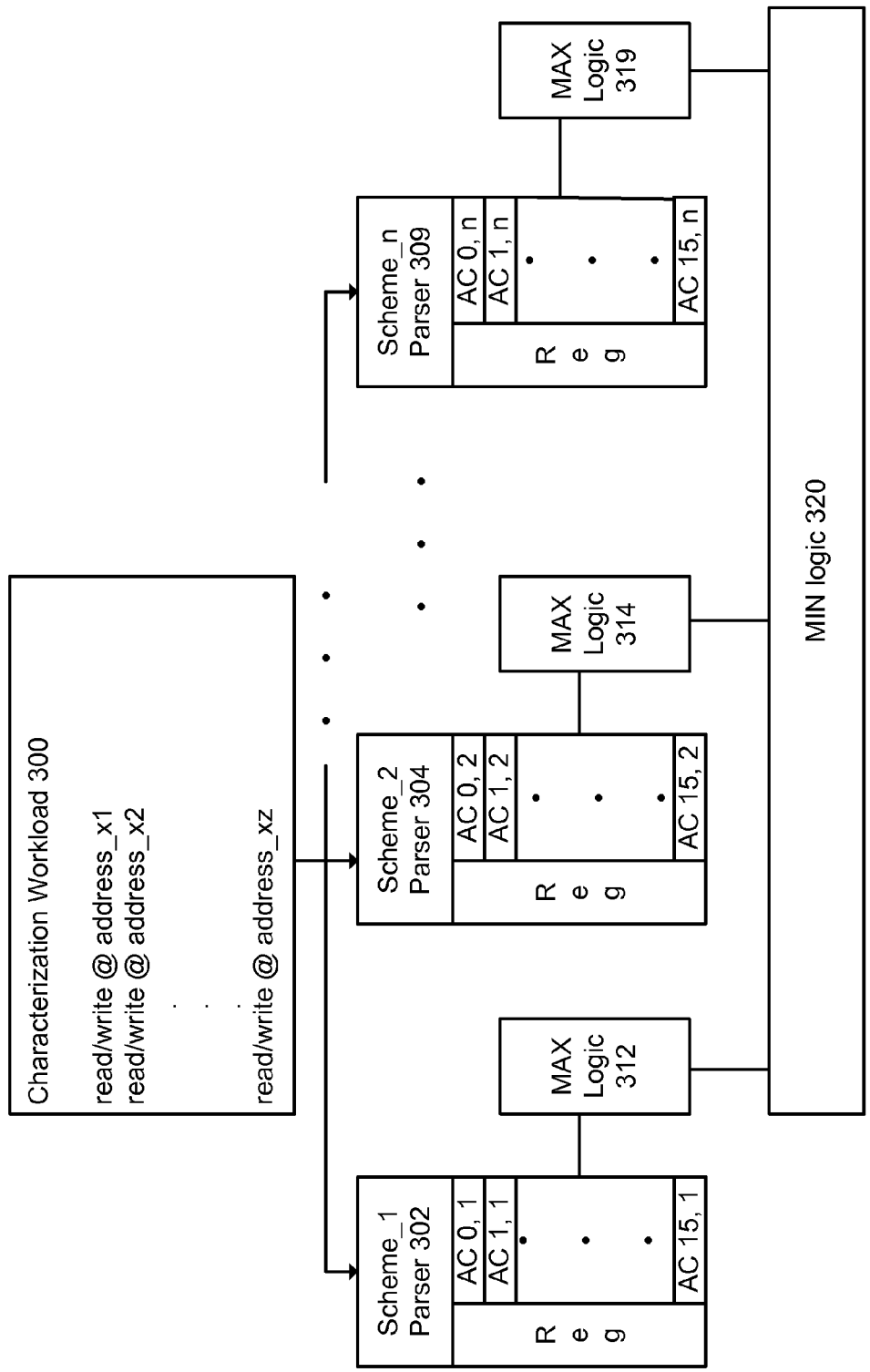
FIG. 3 is a block diagram of logic to select one of a plurality of address decoding schemes according to an embodiment of the invention.

FIG. 3 is a block diagram of logic to select one of a plurality of address decoding schemes according to an embodiment of the invention. In this embodiment, characterization workload 300 is shown to include a set of read/write instructions to various addresses (said set having z number of instructions).

In this embodiment, the system memory controller may utilize any of n number of address decoding schemes. Once the calibration is initiated during system boot-up, the memory controller starts recording the target addresses of all the memory packets received while executing a customer/user-specific characterization workload and determines which memory bank they would correspond to under each of the pre-determined address mapping schemes. In this embodiment, the system supports n address mapping schemes, and thus the system includes n×the number of banks (in this example, 16) registers to keep the access count per bank for each scheme. Said registers are organized per scheme—i.e., the system includes register set 302 for the first memory address scheme parser, register set 304 for the second memory address scheme parser, and so on until register set 309 for the n-th memory address scheme parser. In other embodiments, less register sets may be utilized.

In this embodiment, max logic 312 determines which of the 16 memory banks has the highest number of memory accesses when executing characterization workload 300 based on the first memory address mapping scheme; max logic 314 determines which of the 16 memory banks has the highest number of memory accesses when executing characterization workload 300 based on the second memory address mapping scheme; and so on until max logic 319 determines which of the 16 memory banks has the highest number of memory accesses when executing characterization workload 300 based on the n-th memory address mapping scheme. Min logic 320 may determine which memory address mapping scheme to select based on the lowest number determined by each of said max logic components.

As an example to illustrate the functionality of the above logic, if characterization workload 300 comprises 160 instructions, then the highest number any max logic component may record is 160 (i.e., all instructions of the workload would be directed towards a single bank under the respective address mapping scheme) and the lowest number any max logic component may record is 10 (i.e., all 16 memory banks would receive the same number of accesses under the respective address mapping scheme). Thus, in this example scenario, the memory address scheme yielding a max logic value closest to '10' would be presumed to provide the most optimal performance for the system.

Thus, in some embodiments of the invention, the memory address mapping scheme that yields the minimum number of accesses for the bank with the maximum accesses, thus achieving the best spread of accesses among the memory banks in the system, is selected as the address mapping scheme for the system until the next calibration event. Once the selection is made, the circuitries for address mappings schemes that are not selected may be powered down and only the selected one continue to perform address decoding.

Figure 4:
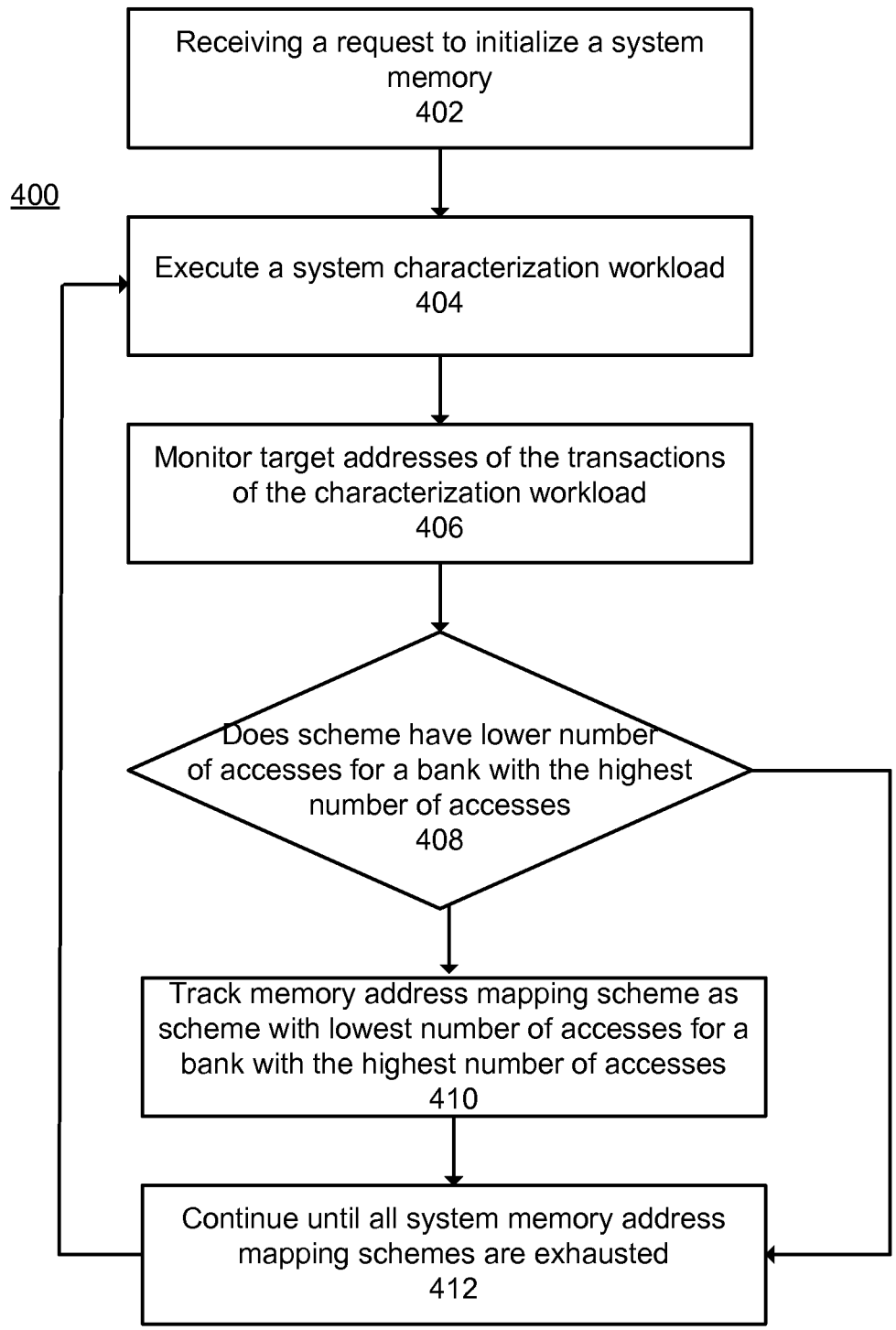
FIG. 4 is a flow chart describing a process for selecting a memory address mapping scheme according to an embodiment of the invention.

FIG. 4 is a flow chart describing a process for selecting a memory address mapping scheme according to an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

In this embodiment, process 400 includes executing operations for receiving a request to initialize a system memory including a plurality of memory banks, 402. Said request may be received in response to a system reset, or may be a run-time request. During the system initialization, a system characterization workload may be executed, 404. Said system characterization workload includes a plurality of transactions directed towards the system memory, and may comprise any number of transactions. The characterization workload is executed using each of a plurality of memory address mapping schemes for memory settings for the system memory.

During the execution of the characterization workload, target addresses of the plurality of transactions directed towards the system memory are monitored, 406. Any module or logic similar to the register sets described in FIG. 3 may be used. For each memory address scheme included in the system, the number of accesses for a bank with a highest number of accesses is recorded, 408, and the memory address mapping scheme with the lowest number of accesses for a bank with a highest number of accesses is tracked, 410. The above operations are executed until all memory address mapping schemes included in the system are exhausted, 412.

FIG. 5 is a block diagram of a system to utilize an embodiment of the invention. System 500 may describe a server platform, or may be included in, for example, a desktop computer, a laptop computer, a tablet computer, a netbook, a notebook computer, a personal digital assistant (PDA), a server, a workstation, a cellular telephone, a mobile computing device, an Internet appliance, an MP3 or media player or any other type of computing device.

System 500 may include processor 510 to exchange data, via system bus 520, with user interface 560, system memory 530, peripheral device controller 540 and network connector 550. Said system memory may include NAND flash memories, NOR flash memories, Phase Change Memories (PCM), PCM comprised of arrays of phase change memory cells and switches (PCMS), and silicon nanowire-based non-volatile memory cells, and be controlled by a system controller capable of workload adaptive memory address mapping according to any of the embodiments of the invention described above.

System 500 may further include antenna and RF circuitry 570 to send and receive signals to be processed by the various elements of system 500. The above described antenna may be a directional antenna or an omni-directional antenna. As used herein, the term omni-directional antenna refers to any antenna having a substantially uniform pattern in at least one plane. For example, in some embodiments, said antenna may be an omni-directional antenna such as a dipole antenna, or a quarter wave antenna. Also for example, in some embodiments, said antenna may be a directional antenna such as a parabolic dish antenna, a patch antenna, or a Yagi antenna. In some embodiments, system 500 may include multiple physical antennas.

While shown to be separate from network connector 550, it is to be understood that in other embodiments, antenna and RF circuitry 570 may comprise a wireless interface to operate in accordance with, but not limited to, the IEEE 802.11 standard and its related family, Home Plug AV (HPAV), Ultra Wide Band (UWB), Bluetooth, WiMax, or any other form of wireless communication protocol. In other embodiments, RF circuitry 570 may comprise cellular network connectivity logic or modules provided by wireless carriers, such as provided via GSM (global system for mobile communications) or variations or derivatives, CDMA (code division multiple access) or variations or derivatives, TDM (time division multiplexing) or variations or derivatives, or other cellular service standards.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 6A is a block diagram illustrating both an exemplary in-order pipeline and an exemplary register renaming, out-of-order issue/execution pipeline according to embodiments of the invention. FIG. 6B is a block diagram illustrating both an exemplary embodiment of an in-order architecture core and an exemplary register renaming, out-of-order issue/execution architecture core to be included in a processor according to embodiments of the invention. The solid lined boxes in FIGS. 6A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 6A, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624.

FIG. 6B shows processor core 690 including a front end unit 630 coupled to an execution engine unit 650, and both are coupled to a memory unit 670. The core 690 may be a reduced instruction set computing (RISC) core, a complex instruction set computing (CISC) core, a very long instruction word (VLIW) core, or a hybrid or alternative core type. As yet another option, the core 690 may be a special-purpose core, such as, for example, a network or communication core, compression engine, coprocessor core, general purpose computing graphics processing unit (GPGPU) core, graphics core, or the like.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 640. The decode unit 640 (or decoder) may decode instructions, and generate as an output one or more micro-operations, micro-code entry points, microinstructions, other instructions, or other control signals, which are decoded from, or which otherwise reflect, or are derived from, the original instructions. The decode unit 640 may be implemented using various different mechanisms. Examples of suitable mechanisms include, but are not limited to, look-up tables, hardware implementations, programmable logic arrays (PLAs), microcode read only memories (ROMs), etc. In one embodiment, the core 690 includes a microcode ROM or other medium that stores microcode for certain macroinstructions (e.g., in decode unit 640 or otherwise within the front end unit 630). The decode unit 640 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations, central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 658 comprises a vector registers unit, a write mask registers unit, and a scalar registers unit. These register units may provide architectural vector registers, vector mask registers, and general purpose registers. The physical register file(s) unit(s) 658 is overlapped by the retirement unit 654 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664). It should also be understood that where separate pipelines are used, one or more of these pipelines may be out-of-order issue/execution and the rest in-order.

The set of memory access units 664 is coupled to the memory unit 670, which includes a data TLB unit 672 coupled to a data cache unit 674 coupled to a level 2 (L2) cache unit 676. In one exemplary embodiment, the memory access units 664 may include a load unit, a store address unit, and a store data unit, each of which is coupled to the data TLB unit 672 in the memory unit 670. The instruction cache unit 634 is further coupled to a level 2 (L2) cache unit 676 in the memory unit 670. The L2 cache unit 676 is coupled to one or more other levels of cache and eventually to a main memory.

By way of example, the exemplary register renaming, out-of-order issue/execution core architecture may implement the pipeline 600 as follows: 1) the instruction fetch 638 performs the fetch and length decoding stages 602 and 604; 2) the decode unit 640 performs the decode stage 606; 3) the rename/allocator unit 652 performs the allocation stage 608 and renaming stage 610; 4) the scheduler unit(s) 656 performs the schedule stage 612; 5) the physical register file(s) unit(s) 658 and the memory unit 670 perform the register read/memory read stage 614; the execution cluster 660 performs the execute stage 616; 6) the memory unit 670 and the physical register file(s) unit(s) 658 perform the write back/memory write stage 618; 7) various units may be involved in the exception handling stage 622; and 8) the retirement unit 654 and the physical register file(s) unit(s) 658 perform the commit stage 624.

The core 690 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 690 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 634/674 and a shared L2 cache unit 676, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 7B:
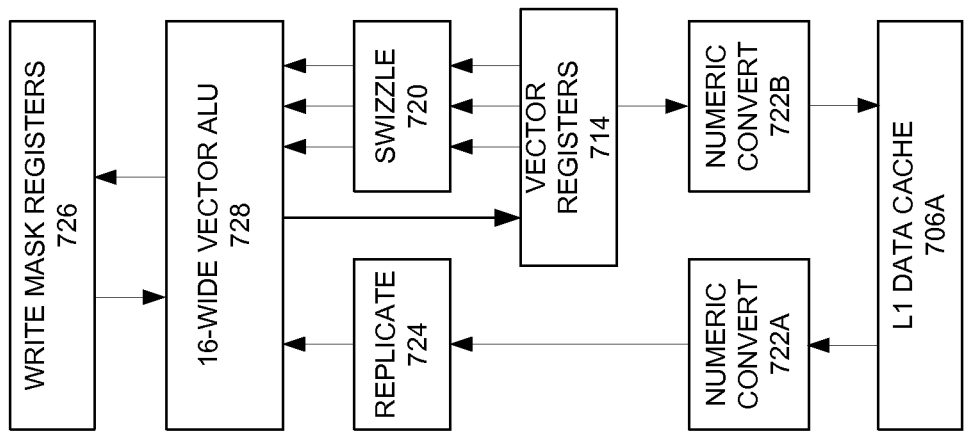
FIGS. 7A-B illustrate a block diagram of a more specific exemplary in-order core architecture, which core would be one of several logic blocks (including other cores of the same type and/or different types) in a chip.
Figure 7A:
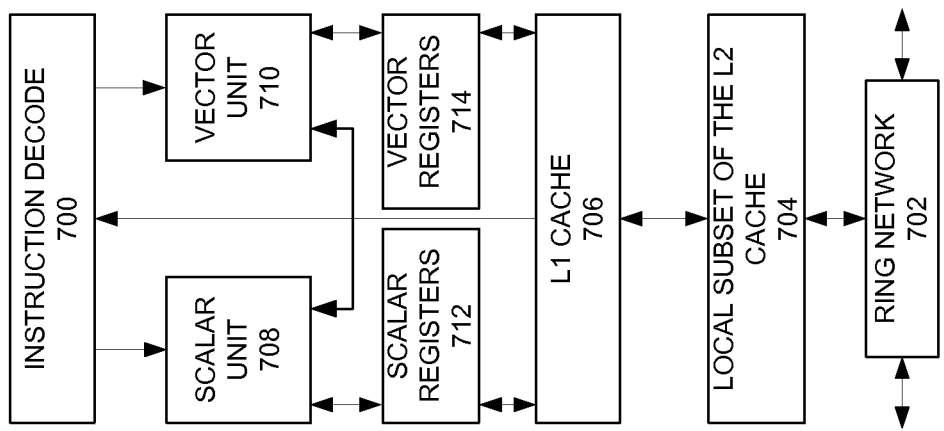

FIGS. 7A-B illustrates a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 7A is a block diagram of a single processor core, along with its connection to the on-die interconnect network 702 and with its local subset of the Level 2 (L2) cache 704, according to embodiments of the invention. In one embodiment, an instruction decoder 700 supports the x86 instruction set with a packed data instruction set extension. An L1 cache 706 allows low-latency accesses to cache memory into the scalar and vector units. While in one embodiment (to simplify the design), a scalar unit 708 and a vector unit 710 use separate register sets (respectively, scalar registers 712 and vector registers 714) and data transferred between them is written to memory and then read back in from a level 1 (L1) cache 706, alternative embodiments of the invention may use a different approach (e.g., use a single register set or include a communication path that allow data to be transferred between the two register files without being written and read back).

The local subset of the L2 cache 704 is part of a global L2 cache that is divided into separate local subsets, one per processor core. Each processor core has a direct access path to its own local subset of the L2 cache 704. Data read by a processor core is stored in its L2 cache subset 704 and can be accessed quickly, in parallel with other processor cores accessing their own local L2 cache subsets. Data written by a processor core is stored in its own L2 cache subset 704 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 7B is an expanded view of part of the processor core in FIG. 7A according to embodiments of the invention. FIG. 7B includes an 1 data cache 706A part of the L1 cache 704, as well as more detail regarding the vector unit 710 and the vector registers 714. Specifically, the vector unit 710 is a 16-wide vector processing unit (VPU) (see the 16-wide ALU 728), which executes one or more of integer, single-precision float, and double-precision float instructions. The VPU supports swizzling the register inputs with swizzle unit 720, numeric conversion with numeric convert units 722A-B, and replication with replication unit 724 on the memory input. Write mask registers 726 allow predicating resulting vector writes.

Figure 8:
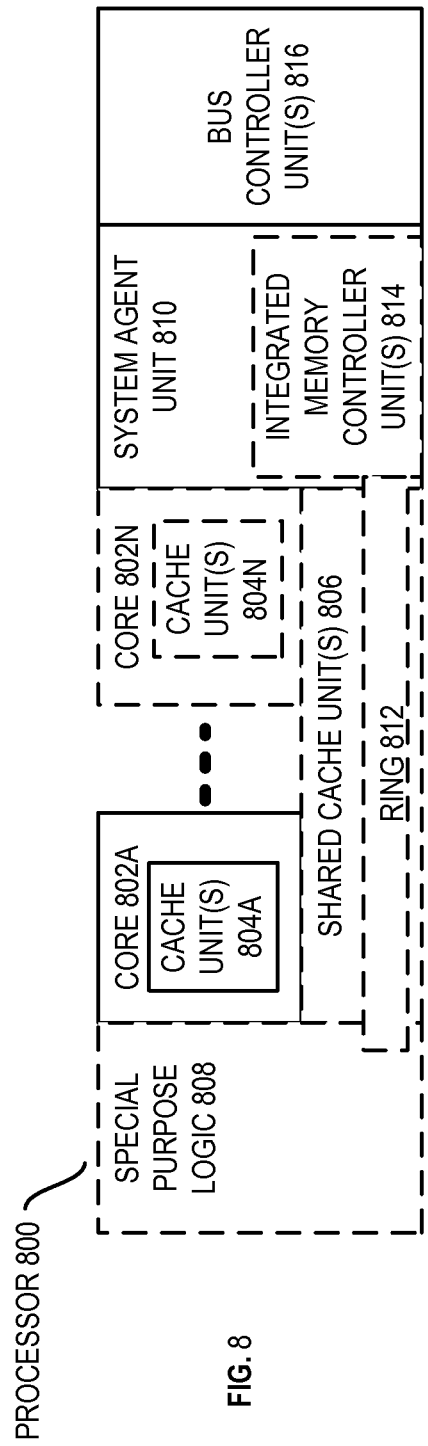
FIG. 8 is a block diagram of a processor 800 that may have more than one core, may have an integrated memory controller, and may have integrated graphics according to embodiments of the invention.

FIG. 8 is a block diagram of a processor 800 that may have more than one core, may have an integrated memory controller, and may have integrated graphics according to embodiments of the invention. The solid lined boxes in FIG. 8 illustrate a processor 800 with a single core 802A, a system agent 810, a set of one or more bus controller units 816, while the optional addition of the dashed lined boxes illustrates an alternative processor 800 with multiple cores 802A-N, a set of one or more integrated memory controller unit(s) 814 in the system agent unit 810, and special purpose logic 808.

Thus, different implementations of the processor 800 may include: 1) a CPU with the special purpose logic 808 being integrated graphics and/or scientific (throughput) logic (which may include one or more cores), and the cores 802A-N being one or more general purpose cores (e.g., general purpose in-order cores, general purpose out-of-order cores, a combination of the two); 2) a coprocessor with the cores 802A-N being a large number of special purpose cores intended primarily for graphics and/or scientific (throughput); and 3) a coprocessor with the cores 802A-N being a large number of general purpose in-order cores. Thus, the processor 800 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 800 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 806, and external memory (not shown) coupled to the set of integrated memory controller units 814. The set of shared cache units 806 may include one or more mid-level caches, such as level 2 (L2), level 3 (L3), level 4 (L4), or other levels of cache, a last level cache (LLC), and/or combinations thereof. While in one embodiment a ring based interconnect unit 812 interconnects the integrated graphics logic 808, the set of shared cache units 806, and the system agent unit 810/integrated memory controller unit(s) 814, alternative embodiments may use any number of well-known techniques for interconnecting such units. In one embodiment, coherency is maintained between one or more cache units 806 and cores 802-A-N.

In some embodiments, one or more of the cores 802A-N are capable of multi-threading. The system agent 810 includes those components coordinating and operating cores 802A-N. The system agent unit 810 may include for example a power control unit (PCU) and a display unit. The PCU may be or include logic and components needed for regulating the power state of the cores 802A-N and the integrated graphics logic 808. The display unit is for driving one or more externally connected displays.

The cores 802A-N may be homogenous or heterogeneous in terms of architecture instruction set; that is, two or more of the cores 802A-N may be capable of execution the same instruction set, while others may be capable of executing only a subset of that instruction set or a different instruction set.

FIGS. 9-12 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 9:
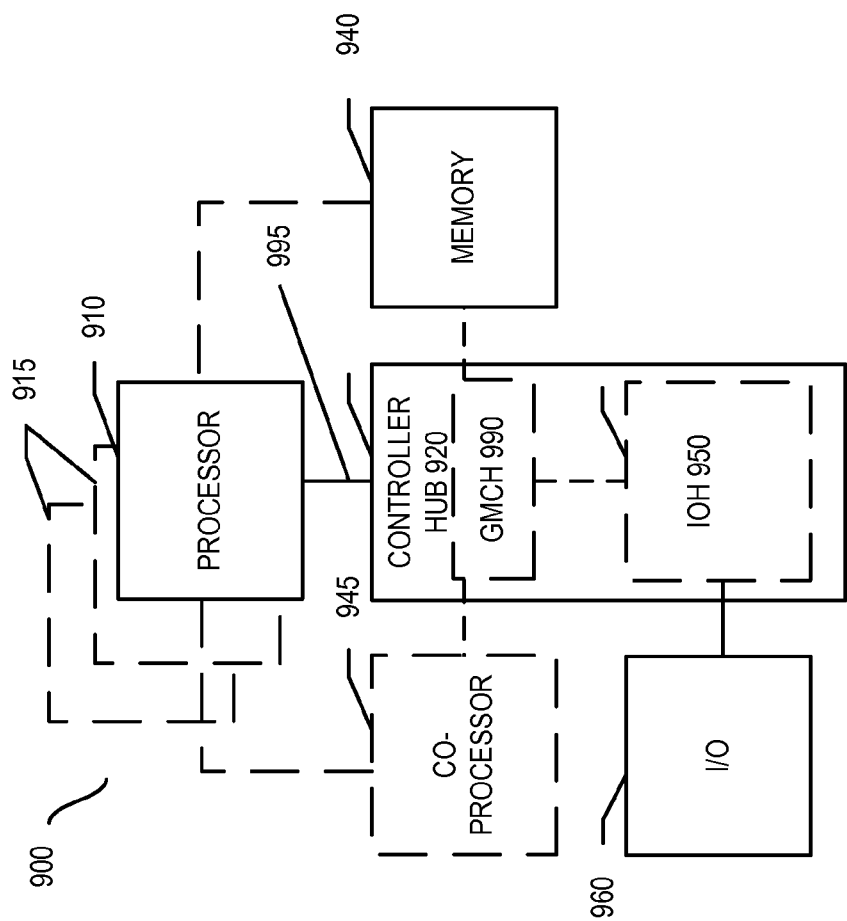
FIG. 9 is a block diagram of an exemplary computer architecture according to an embodiment of the invention.

Referring now to FIG. 9, shown is a block diagram of a system 900 in accordance with one embodiment of the present invention. The system 900 may include one or more processors 910, 915, which are coupled to a controller hub 920. In one embodiment the controller hub 920 includes a graphics memory controller hub (GMCH) 990 and an Input/Output Hub (IOH) 950 (which may be on separate chips); the GMCH 990 includes memory and graphics controllers to which are coupled memory 940 and a coprocessor 945; the IOH 950 is couples input/output (I/O) devices 960 to the GMCH 990. Alternatively, one or both of the memory and graphics controllers are integrated within the processor (as described herein), the memory 940 and the coprocessor 945 are coupled directly to the processor 910, and the controller hub 920 in a single chip with the IOH 950.

The optional nature of additional processors 915 is denoted in FIG. 9 with broken lines. Each processor 910, 915 may include one or more of the processing cores described herein and may be some version of the processor 800.

The memory 940 may be, for example, dynamic random access memory (DRAM), phase change memory (PCM), or a combination of the two. For at least one embodiment, the controller hub 920 communicates with the processor(s) 910, 915 via a multi-drop bus, such as a frontside bus (FSB), point-to-point interface such as QuickPath Interconnect (QPI), or similar connection 995.

In one embodiment, the coprocessor 945 is a special-purpose processor, such as, for example, a high-throughput MIC processor, a network or communication processor, compression engine, graphics processor, GPGPU, embedded processor, or the like. In one embodiment, controller hub 920 may include an integrated graphics accelerator.

There can be a variety of differences between the physical resources 910, 915 in terms of a spectrum of metrics of merit including architectural, microarchitectural, thermal, power consumption characteristics, and the like.

In one embodiment, the processor 910 executes instructions that control data processing operations of a general type. Embedded within the instructions may be coprocessor instructions. The processor 910 recognizes these coprocessor instructions as being of a type that should be executed by the attached coprocessor 945. Accordingly, the processor 910 issues these coprocessor instructions (or control signals representing coprocessor instructions) on a coprocessor bus or other interconnect, to coprocessor 945. Coprocessor(s) 945 accept and execute the received coprocessor instructions.

Figure 10:
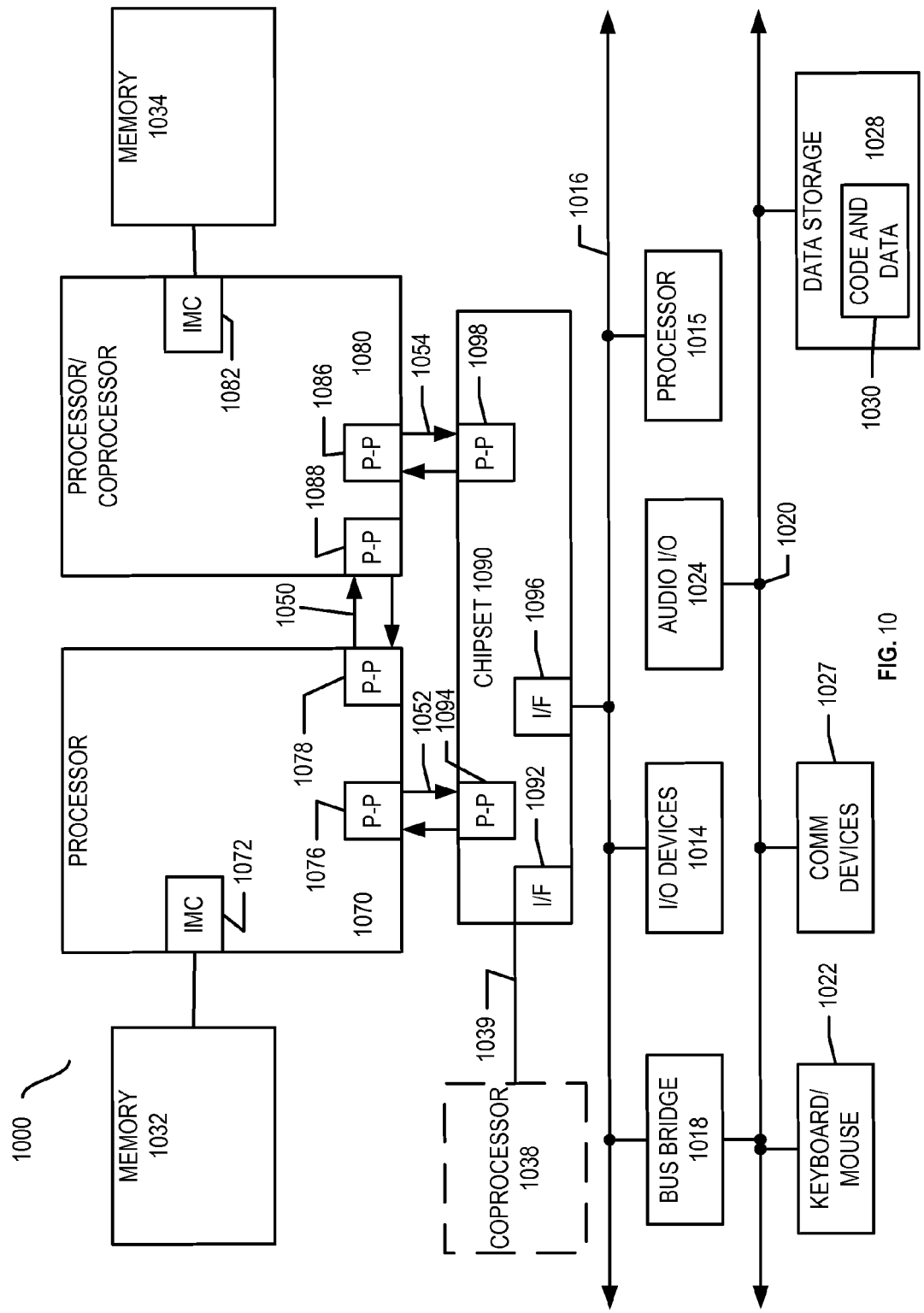
FIG. 10 is a block diagram of an exemplary computer architecture according to an embodiment of the invention.

Referring now to FIG. 10, shown is a block diagram of a first more specific exemplary system 1000 in accordance with an embodiment of the present invention. As shown in FIG. 10, multiprocessor system 1000 is a point-to-point interconnect system, and includes a first processor 1070 and a second processor 1080 coupled via a point-to-point interconnect 1050. Each of processors 1070 and 1080 may be some version of the processor 800. In one embodiment of the invention, processors 1070 and 1080 are respectively processors 910 and 915, while coprocessor 1038 is coprocessor 945. In another embodiment, processors 1070 and 1080 are respectively processor 910 coprocessor 945.

Processors 1070 and 1080 are shown including integrated memory controller (IMC) units 1072 and 1082, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may optionally exchange information with the coprocessor 1038 via a high-performance interface 1039. In one embodiment, the coprocessor 1038 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present invention is not so limited.

As shown in FIG. 10, various I/O devices 1014 may be coupled to first bus 1016, along with a bus bridge 1018 which couples first bus 1016 to a second bus 1020. In one embodiment, one or more additional processor(s) 1015, such as coprocessors, high-throughput MIC processors, GPGPU's, accelerators (such as, e.g., graphics accelerators or digital signal processing (DSP) units), field programmable gate arrays, or any other processor, are coupled to first bus 1016. In one embodiment, second bus 1020 may be a low pin count (LPC) bus. Various devices may be coupled to a second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to the second bus 1020. Note that other architectures are possible. For example, instead of the point-to-point architecture of FIG. 10, a system may implement a multi-drop bus or other such architecture.

Figure 11:
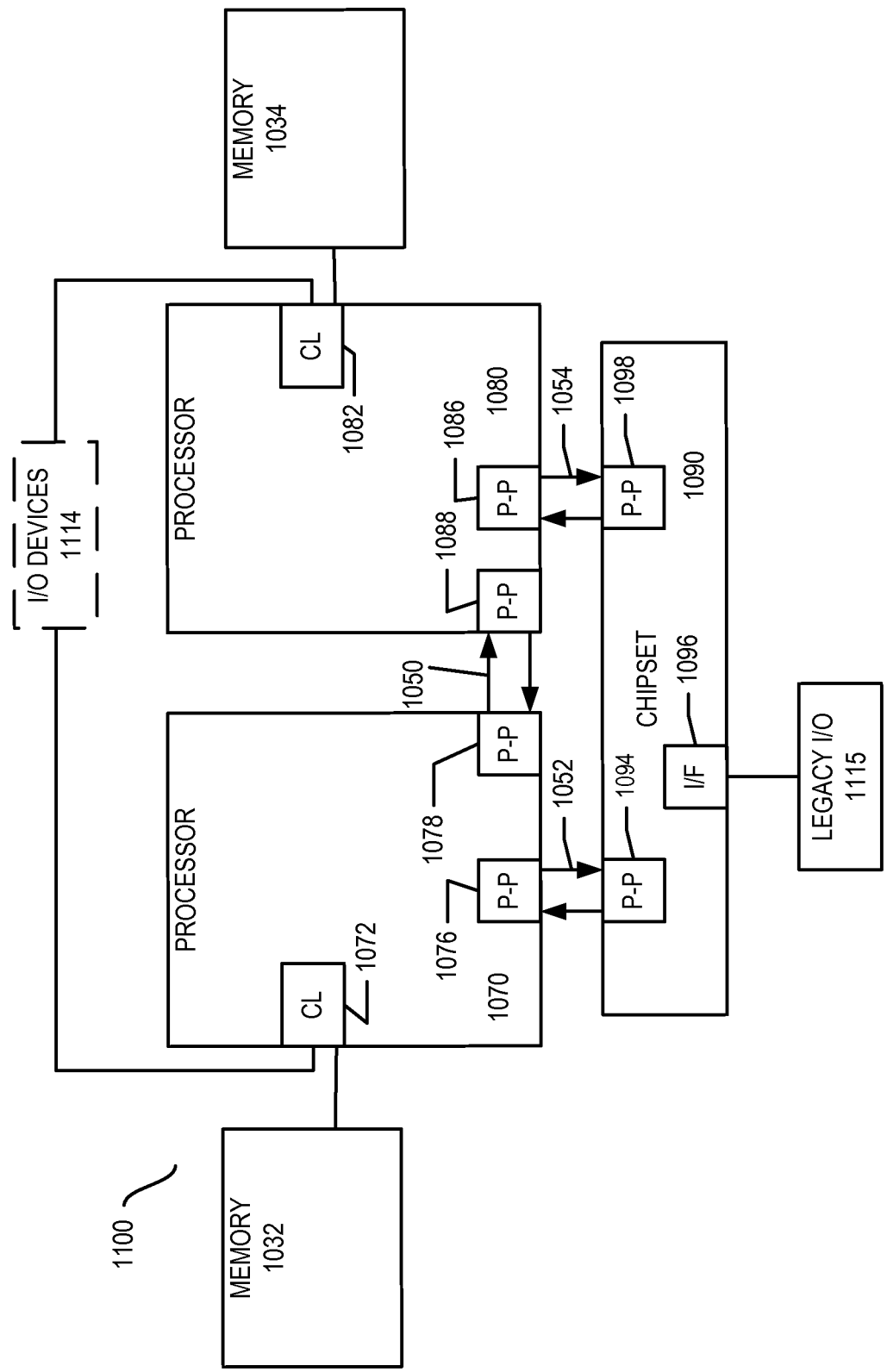
FIG. 11 is a block diagram of an exemplary computer architecture according to an embodiment of the invention.

Referring now to FIG. 11, shown is a block diagram of a second more specific exemplary system 1100 in accordance with an embodiment of the present invention. Like elements in FIGS. 10 and 11 bear like reference numerals, and certain aspects of FIG. 10 have been omitted from FIG. 11 in order to avoid obscuring other aspects of FIG. 11.

FIG. 11 illustrates that the processors 1070, 1080 may include integrated memory and I/O control logic ("CL") 1072 and 1082, respectively. Thus, the CL 1072, 1082 include integrated memory controller units and include I/O control logic. FIG. 11 illustrates that not only are the memories 1032, 1034 coupled to the CL 1072, 1082, but also that I/O devices 1114 are also coupled to the control logic 1072, 1082. Legacy I/O devices 1115 are coupled to the chipset 1090.

Figure 12:
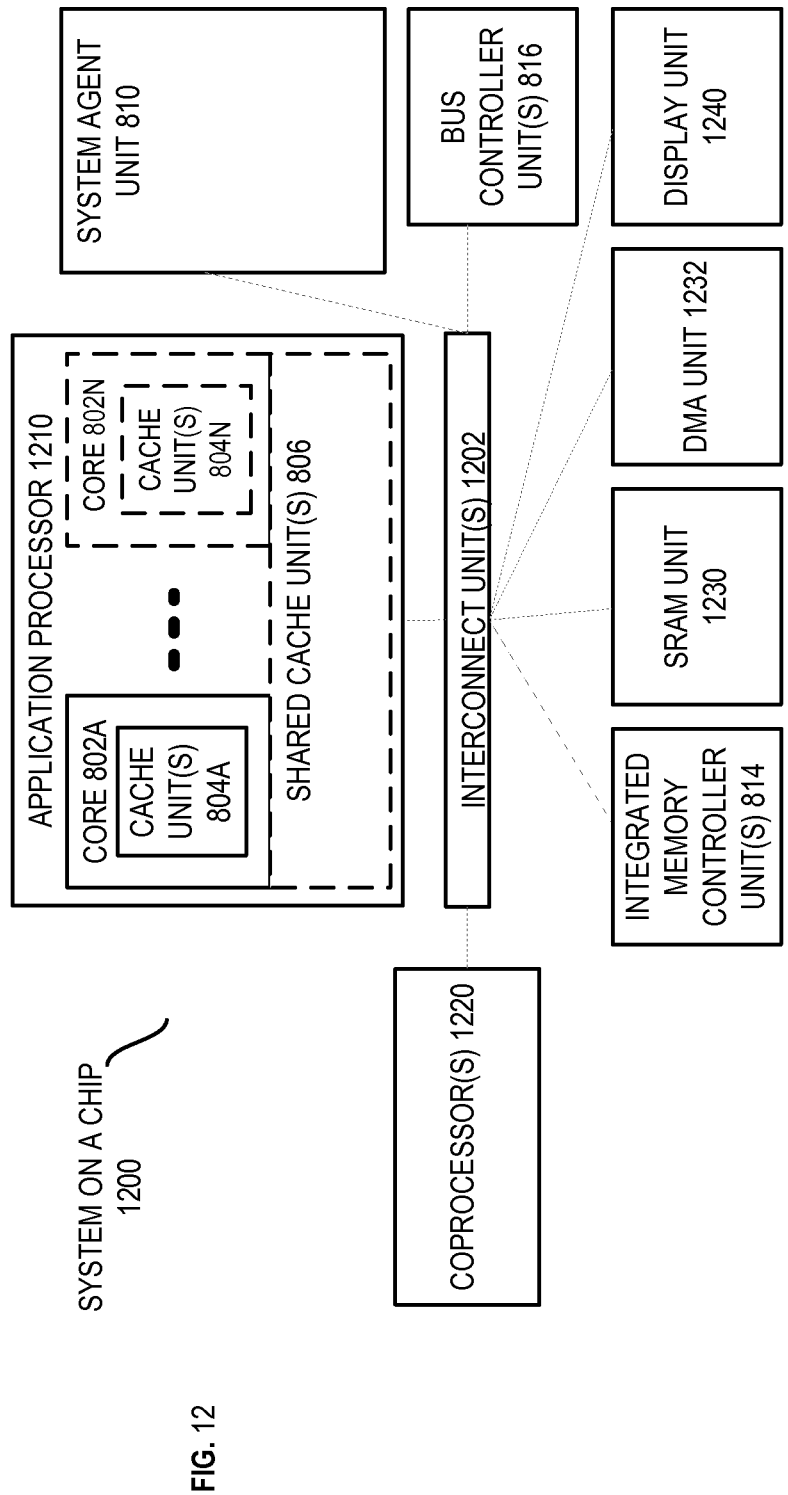
FIG. 12 is a block diagram of an exemplary computer architecture according to an embodiment of the invention.

Referring now to FIG. 12, shown is a block diagram of a SoC 1200 in accordance with an embodiment of the present invention. Similar elements in FIG. 8 bear like reference numerals. Also, dashed lined boxes are optional features on more advanced SoCs. In FIG. 12, an interconnect unit(s) 1202 is coupled to: an application processor 1210 which includes a set of one or more cores 202A-N and shared cache unit(s) 806; a system agent unit 810; a bus controller unit(s) 816; an integrated memory controller unit(s) 814; a set or one or more coprocessors 1220 which may include integrated graphics logic, an image processor, an audio processor, and a video processor; an static random access memory (SRAM) unit 1230; a direct memory access (DMA) unit 1232; and a display unit 1240 for coupling to one or more external displays. In one embodiment, the coprocessor(s) 1220 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1030 illustrated in FIG. 10, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 13:
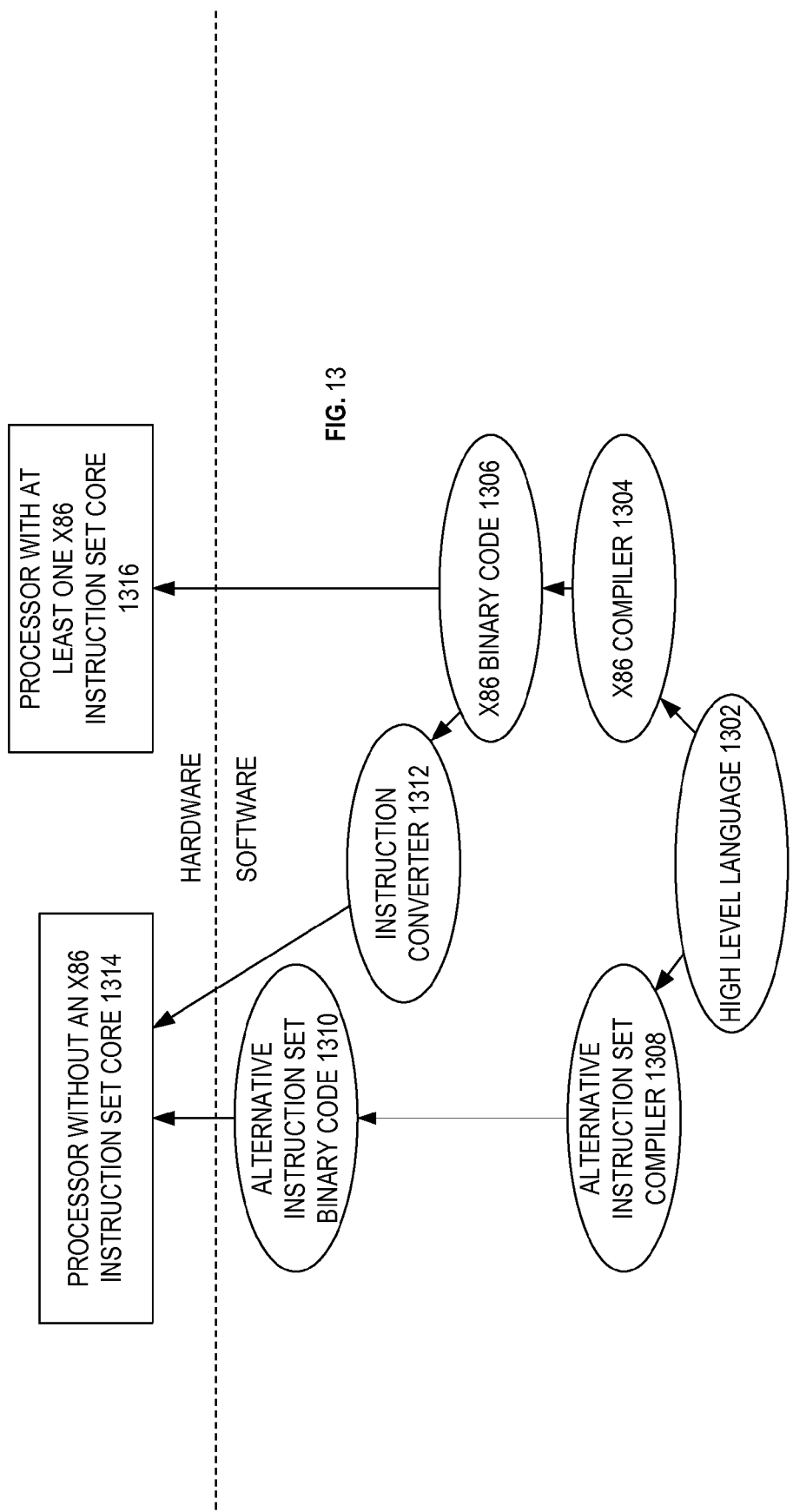
FIG. 13 is a block diagram contrasting the use of a software instruction converter to convert binary instructions in a source instruction set to binary instructions in a target instruction set according to embodiments of the invention.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable non-transitory storage medium may also include a storage or database from which content can be downloaded. Said computer readable medium may also include a device or product having content stored thereon at a time of sale or delivery. Thus, delivering a device with stored content, or offering content for download over a communication medium may be understood as providing an article of manufacture with such content described herein.

What is claimed is:

1. A method comprising:
receiving a request to initialize a system memory including a plurality of memory banks; and
during the initialization of the system memory:
   executing, using a plurality of memory address mapping schemes for memory settings for the system memory, a system characterization workload including a plurality of transactions directed towards the system memory, by monitoring target addresses of the plurality of transactions directed towards the system memory;
   determining, for each memory address mapping scheme:
      a number of accesses for each memory bank, and
      which bank of the plurality of banks has a highest number of memory accesses;
      selecting one of the plurality of memory address mapping schemes for memory settings for the system memory based, at least in part, on:
      the target addresses of the plurality of transactions, and
      a determination of which memory address mapping scheme results in a lowest number of memory accesses among the banks determined to have the highest number of memory accesses.

2. The method of claim 1, wherein the system memory comprises phase-change memory.

3. The method of claim 1, wherein receiving a request to initialize the system memory is in response to a system reset.

4. The method of claim 1, wherein the request to initialize a system memory is a system run-time request and method comprises:
flushing contents of the system memory.

5. An apparatus comprising:
a plurality of memory address mapping schemes; and
logic to
   receive a request to initialize a system memory including a plurality of memory banks; and
   during the initialization of the system memory:
      execute, using the plurality of memory address mapping schemes, a system characterization workload including a plurality of transactions directed towards the system memory;
      monitor target addresses of the plurality of transactions directed towards the system memory;
      determine, for each memory address mapping scheme:
         a number of accesses for each memory bank, and
         which bank of the plurality of banks has a highest number of memory accesses;
      select one of the plurality of memory address mapping schemes for memory settings for the system memory based, at least in part, on:
      the target addresses of the plurality of transactions, and
      a determination of which memory address mapping scheme results in a lowest number of memory accesses among the banks determined to have the highest number of memory accesses.

6. The apparatus of claim 5, wherein the system memory comprises phase-change memory.

7. The apparatus of claim 5, wherein receiving a request to initialize the system memory is in response to a system reset.

8. The apparatus of claim 5, wherein the request to initialize a system memory is a system run-time request, and the logic to further:
flush contents of the system memory.

9. A system comprising:
a processor;
a memory;
a memory controller including a plurality of memory address mapping schemes; and
logic to
   receive a request to initialize a system memory including a plurality of memory banks; and
   during the initialization of the system memory:
      execute, using the plurality of memory address mapping schemes, a system characterization workload including a plurality of transactions directed towards the system memory;
      monitor target addresses of the plurality of transactions directed towards the system memory,
      determine, for each memory address mapping scheme:
         a number of accesses for each memory bank, and
         which bank of the plurality of banks has a highest number of memory accesses;
      select one of the plurality of memory address mapping schemes for memory settings for the system memory based, at least in part, on:
      the target addresses of the plurality of transactions, and
      a determination of which memory address mapping scheme results in a lowest number of memory accesses among the banks determined to have the highest number of memory accesses.

10. The system of claim 9, wherein the memory comprises phase-change memory.

11. The system of claim 9, wherein receiving a request to initialize the system memory is in response to a system reset.

12. The system of claim 9, wherein the request to initialize a system memory is a system run-time request, and the logic to further:
flush contents of the system memory.

* * * * *